United States Patent
Egelmeers et al.

(10) Patent No.: US 8,238,859 B2
(45) Date of Patent: Aug. 7, 2012

(54) RADIO RECEIVER

(75) Inventors: Egelbertus C. J. Egelmeers, Nuenen (NL); Ralph H. A. D. De Graaff, Riel (NL); Dirk N. Van Kalsbeek, Helmond (NL)

(73) Assignee: NXP B.V., Eindhoven (NL)

( * ) Notice: Subject to any disclaimer, the term of this patent is extended or adjusted under 35 U.S.C. 154(b) by 834 days.

(21) Appl. No.: 12/281,987

(22) PCT Filed: Mar. 8, 2007

(86) PCT No.: PCT/IB2007/050774
§ 371 (c)(1),
(2), (4) Date: Sep. 6, 2008

(87) PCT Pub. No.: WO2007/102133
PCT Pub. Date: Sep. 13, 2007

(65) Prior Publication Data
US 2009/0093227 A1    Apr. 9, 2009

(30) Foreign Application Priority Data
Mar. 9, 2006    (EP) .................................. 06110905

(51) Int. Cl.
*H04B 1/18*    (2006.01)
(52) U.S. Cl. ...... 455/191.1; 455/77; 455/87; 455/150.1; 455/160.1; 455/169.1

(58) Field of Classification Search .................. 455/77, 455/87, 150.1, 160.1, 169.1, 169.2, 178.1, 455/191.1, 191.2, 192.3, 193.3, 226.1, 226.2, 455/226.3
See application file for complete search history.

(56) References Cited

U.S. PATENT DOCUMENTS

| | | | |
|---|---|---|---|
| 4,201,960 A | | 5/1980 | Skutta et al. |
| 5,136,719 A | * | 8/1992 | Gaskill et al. .............. 455/193.1 |
| 2003/0083836 A1 | * | 5/2003 | Spencer ........................ 702/107 |
| 2004/0041671 A1 | * | 3/2004 | Van Rumpt ..................... 334/30 |
| 2005/0040909 A1 | | 2/2005 | Waight et al. |
| 2005/0130699 A1 | * | 6/2005 | Kim ........................... 455/550.1 |
| 2005/0190013 A1 | * | 9/2005 | Utsunomiya et al. ......... 333/174 |
| 2005/0215219 A1 | * | 9/2005 | Khorram .................... 455/226.1 |

FOREIGN PATENT DOCUMENTS
EP    0428229 A1    5/1991

* cited by examiner

*Primary Examiner* — Tuan Pham

(57) ABSTRACT

There is provided a method of configuring a radio receiver, the radio receiver comprising signal receiving means, and at least one adjustable component coupled to the signal receiving means; the method comprising setting the at least one component to a first value selected from a plurality of values; measuring the quality of a signal received via the signal receiving means and the at least one adjustable component; repeating the steps of setting and measuring for at least a second value selected from the plurality of values; and determining the value of the at least one adjustable component that provides the highest measured signal quality.

22 Claims, 2 Drawing Sheets

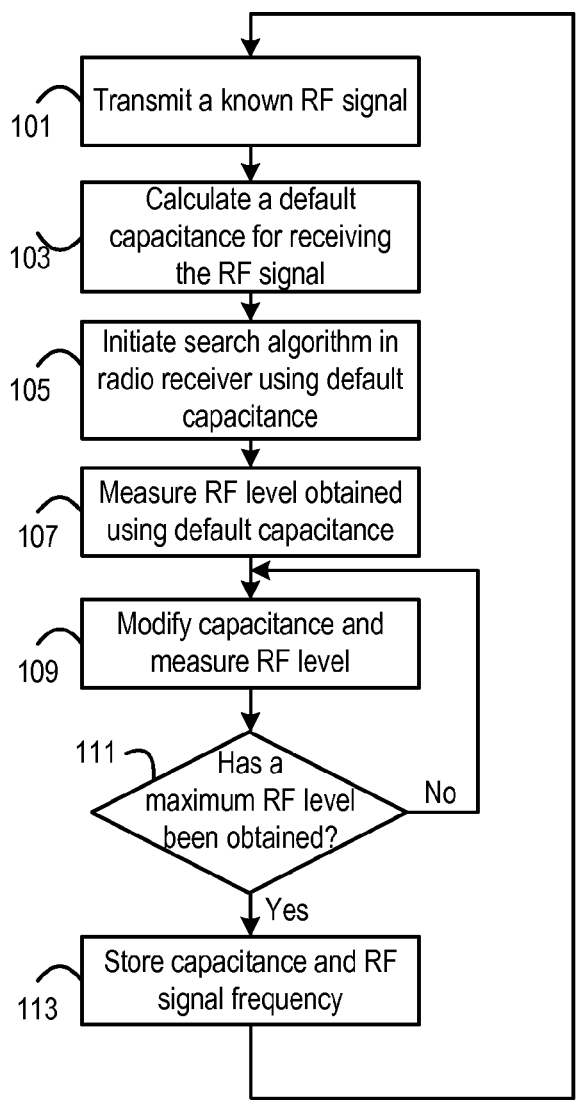
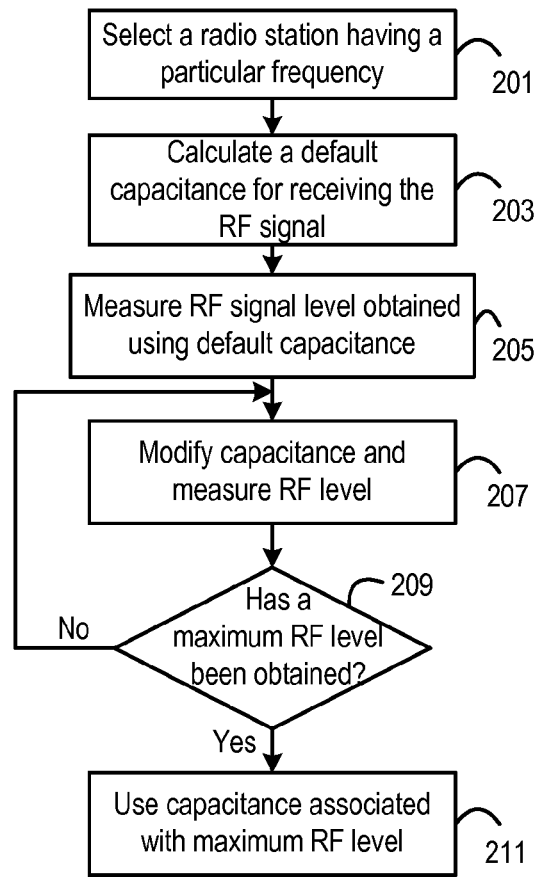
Figure 3
Figure 4

RADIO RECEIVER

TECHNICAL FIELD OF THE INVENTION

This invention relates to radio receivers, and in particular relates to methods and an apparatus for aligning components in a radio receiver to signals at particular frequencies.

BACKGROUND TO THE INVENTION

In an ideal radio receiver, the antenna has a specific optimum length or specific parameters for every unique frequency to be received. The length of the antenna depends on the frequency to be tuned to. The radio front end is also known as a resonance circuit, and should be matching. Changing the frequency, without changing the values of components in the antenna resonance circuit, can lead to a limited mismatch in narrow bands (for example the frequency modulation (FM) band: 87.5 to 108 MHz).

The waveform length is calculated by dividing the speed of light by the frequency (in the following examples, the speed of light is taken to be 300000 km/s). Typically, the length of the antenna for a particular frequency is a quarter of the waveform length. Thus, considering the narrow FM band, the ideal antenna length for 100 MHz is 75 centimetres, the ideal antenna length for 87.5 MHz is 86 centimetres, and the ideal antenna length for 108 MHz is 69 centimetres. However, selecting an antenna length in the middle of this range does not result in severe complications in the reception of signals in the FM band, as the deviation in desired antenna length is approximately 25% across the full band.

However, changing the frequency without changing the values of components in an antenna resonance circuit for use in a wideband application can lead to large mismatch, as the following example shows.

In the medium wave (MW) band, the ideal antenna length for 1000 kHz is 75 metres, the ideal antenna length for 520 kHz is 144 metres, and the ideal antenna length for 1620 kHz is 46 metres. Thus, the deviation of approximately 300% across the full MW band is very severe for the MW band. A poorly tuned antenna that could be derived from the example will result in poor signal reception.

In many medium or long wave (LW) applications, a "ferroceptor" is used. The ferroceptor is a coil-shape magnetic antenna with a ferrite core. It has the advantages that it is a small antenna and is less sensitive to disturbances. However, it also suffers from the problem of poor tuning in wideband applications as outlined above.

It is known to tune antennas in several different ways. Since an antenna is a combination of a coil and one or more capacitors, it is possible to either change the inductance of the coil or the value of the one or more capacitors.

In wideband applications, such as MW and LW applications, a bank of capacitors can be provided. The values of the capacitors are chosen to cover the MW and LW bands as necessary, with regard to the ferroceptor inductance. In use, the antenna must be tuned to the frequency that the radio receiver is tuned to. That is, if it is desired to receive a signal at 700 kHz, the appropriate capacitor from the bank of capacitors must be selected. The tuning calculation is based on the ferroceptor value. For each new frequency selected, a new capacitance has to be calculated.

The inductance of a ferroceptor coil has a certain spread. The result of the capacitance calculation will therefore deviate from the ideal value. Consequently, this will be experienced by the radio end user as poor reception. Therefore, when an antenna is manufactured, the actual inductance value of the ferroceptor needs to be derived, and the inductance or capacitance changed accordingly. However, this tuning is complicated and consumes production time.

Therefore it is an object of the invention to provide for the alignment of an integrated capacitor bank to wideband frequency coverage used in radio receivers, which removes the need to adjust components external to the IC.

SUMMARY OF THE INVENTION

In accordance with a first aspect of the invention, there is provided a method of configuring a radio receiver, the radio receiver comprising signal receiving means, and at least one adjustable component coupled to the signal receiving means; the method comprising: setting the at least one component to a first value selected from a plurality of values; measuring the quality of a signal received via the signal receiving means and the at least one adjustable component; repeating the steps of setting and measuring for at least a second value selected from the plurality of values; and determining the value of the at least one adjustable component that provides the highest measured signal quality.

In accordance with a second aspect of the invention, there is provided a radio receiver, comprising: signal receiving means; at least one adjustable component coupled to the signal receiving means; and processing means adapted to: set the at least one component to a first value selected from a plurality of values; measure the quality of a signal received via the signal receiving means and the at least one adjustable component; repeat the steps of setting and measuring for at least a second value selected from the plurality of values; and determine the value of the at least one adjustable component that provides the highest measured signal quality.

These and other aspects of the invention will be apparent from and elucidated with reference to the embodiments described hereinafter.

BRIEF DESCRIPTION OF THE DRAWINGS

The invention will now be described, by way of example only, with reference to the following drawings, in which:

FIG. 3 shows a method in accordance with a first aspect of the invention; and

FIG. 4 shows a method in accordance with a second aspect of the invention.

DETAILED DESCRIPTION OF THE PREFERRED EMBODIMENTS

Figure 1:
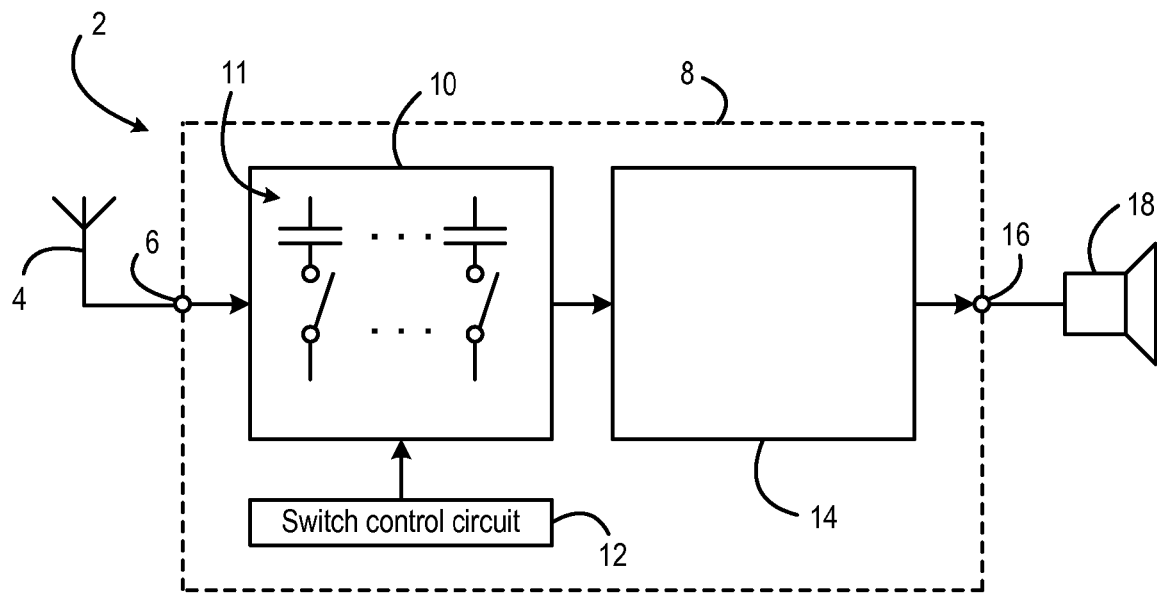
FIG. 1 shows a block schematic of a radio receiver in accordance with the invention.

FIG. 1 shows a block schematic of a radio receiver 2 in accordance with the invention. The radio receiver 2 comprises an antenna element 4, such as a coil, which receives radio signals and which is connected to an input 6 of receiver circuitry 8. The receiver circuitry 8 comprises an integrated RF stage 10 which includes a switched bank of capacitors 11, switch control circuitry 12 for controlling the switching of the bank of capacitors 11 in integrated RF stage 10 and processing circuitry 14 coupled to the output of the integrated RF stage 10. The processing circuitry 14 provides an audio output signal at output 16 of the receiver circuitry 8, which is supplied to loud speaker 18.

As described above, as the frequency of the signal to be received is changed (i.e. the radio receiver 2 is tuned to a different radio station), the capacitance of the receiver circuitry 8 must be changed in order to avoid a large mismatch. That is, the capacitor or combination of capacitors in the bank of capacitors 11 that provides the highest received signal quality (such as the highest RF signal level) should be selected for use in receiving RF signals at that frequency.

Figure 2:
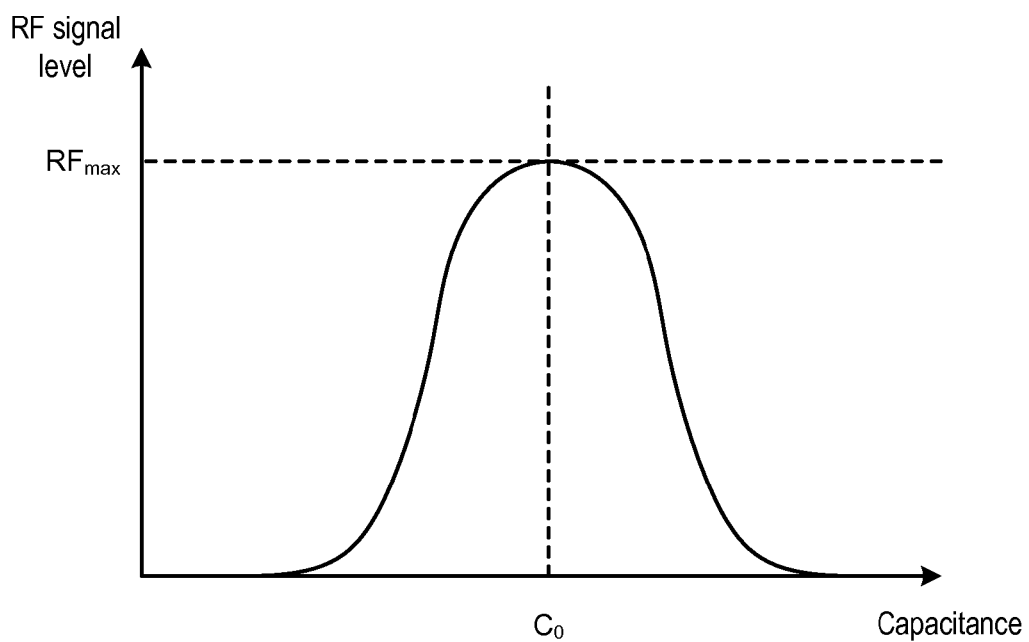
FIG. 2 is a graph illustrating the change in received RF signal levels as the capacitance of the antenna varies.

This is illustrated in FIG. 2 which shows how the RF signal level in the receiver circuitry 8 varies with the capacitance used in the integrated RF stage 10 for an RF signal at a particular frequency. The highest possible received signal level, $RF_{max}$, occurs when the capacitance of the integrated RF stage 10 is at an optimum value, denoted $C_0$. As the capacitance varies from $C_0$, the received RF signal level decreases from the highest level, $RF_{max}$.

FIG. 3 shows a flow chart of a method in accordance with the invention for selecting an appropriate capacitance from the bank of capacitors for use in receiving radio signals at a particular frequency, thereby avoiding the need to derive an antenna offset during the manufacture of the radio receiver 2.

The method starts in step 101 in which an RF signal is transmitted that has a preferably known frequency and power level. In step 103, a default capacitance is calculated for the frequency used by the known RF signal using equations known in the art.

For example, the default capacitance can be calculated from the following equation:

$$\text{Capacitance selection} = \frac{(\text{maximum frequency in the band}) - (\text{selected frequency})}{(\text{channel spacing})}$$

Thus, when the maximum frequency is 1700 kHz, the selected frequency is 600 kHz and the channel spacing is 10 kHz, the default capacitance selection will be 110. The capacitance selection is actually a pointer to a specified capacitance selection, which can comprise more than one capacitor.

In step 105, the radio receiver 2 initiates a search algorithm using the default capacitance to detect the RF signal. The default capacitance may correspond to the value of a particular capacitor in the switched bank of capacitors 11, in which case the switch control circuit 12 causes the integrated RF stage 10 to use that capacitor in the circuitry for receiving the RF signal, or the default capacitance may correspond to the value of two or more of the capacitors in the switched bank of capacitors 11 when they are used in series or parallel, in which case the switch control circuit 12 controls the integrated RF stage 10 to use the appropriate combination of capacitors in the bank of capacitors 11.

In step 107, the radio receiver 2 measures the signal quality of the received RF signal obtained using the default capacitance. In this illustrated embodiment, the signal quality is measured by measuring a RF signal level of the received RF signal. Preferably, a Received Signal Strength Indication (RSSI) is used to measure the RF signal level. However, it will be appreciated by a person skilled in the art that alternative methods of measuring RF signal quality could be used, such as signal-to-noise ratios and total harmonic distortion (but only under laboratory conditions).

In step 109, the capacitance value is modified, which may involve switching to a different capacitor, or a different combination of capacitors, in the bank of capacitors 11, and the RF signal level is measured, again preferably using the RSSI. The capacitance value can be increased or decreased as required.

In step 111, it is determined whether a capacitance has been identified that results in a maximum received RF signal or highest signal quality being received. If a maximum RF level has not been obtained, the process returns to step 109 where the capacitance value is again modified and the RF signal level measured.

If a capacitance value has been identified that results in a maximum RF level being received (i.e. the capacitance values surrounding the identified value have been tested and result in a lower RF signal level being received than with the identified value), the process passes to step 113 in which that capacitance value is stored in a memory (not shown in FIG. 1), along with the associated frequency of the RF signal. The capacitance may be stored as a value or as a configuration of the switches in the integrated RF stage 10.

If desired, the process can then return to step 101 and repeat for other frequencies in the band.

Preferably, the further iterations of step 109 to modify the capacitance value take into account the previous modifications to the capacitance value and its measured effect on the RF signal level.

For example, if a modification to a first capacitance value results in the measured RF signal level decreasing, a third capacitance value will be selected that is either an intermediate value to the first and second values to determine if the optimum capacitance value $C_0$ lies between the first and second values, a value that is higher than the first value, if the second value is lower than the first value, or a value that is lower than the first value, if the second value is higher than the second value. If the modification to the first capacitance value results in the measured RF signal level increasing, a third capacitance value will be selected that is either an intermediate value to the first and second values to determine if the optimum capacitance value $C_0$ lies between the first and second values, a value that is higher than the second value if the first value is lower than the second value, or a value that is lower than the second value if the first value is higher than the second value.

In one embodiment of the invention, the value of the capacitance is adjusted to an adjacent capacitance value that is representable by the bank of capacitors 11. Thus, in the example above, it will not be possible to select the next capacitance value as an intermediate value between the first and second values, so instead a value will be selected that is higher or lower than the first or second value, depending on the RF signal levels measured for the first and second values.

In an alternative embodiment of the invention, the value of the capacitance is adjusted by a percentage in each iteration of step 109. Preferably, after a first adjustment by a particular percentage, further adjustments to the capacitance value are made as a proportion of the particular percentage until the capacitance value that results in the highest measured RF signal level is identified.

As the process in FIG. 3 is preferably implemented during the manufacturing process (i.e. before the radio receiver is released to a consumer) the method can be implemented at least in part in a microcontroller or other diagnostic and testing instrument that is separate to the radio receiver 2, or the method can be implemented in the radio receiver 2 itself.

FIG. 4 shows a flow chart of an alternative method in accordance with the invention for selecting an appropriate capacitance for the bank of capacitors for use in receiving radio signals at a particular frequency when the radio receiver 2 is in use by an end user, which avoids the need to derive an antenna offset during the manufacture of the radio receiver 2, and which can compensate for temperature variations and aging in the components of the radio receiver 2.

The method starts in step 201 in which the end user tunes the radio receiver 2 to a frequency of a desired radio station. In step 203, a default capacitance is calculated for the frequency of the radio station using equations known in the art. Alternatively, if a capacitance value for the desired or an adjacent frequency has been determined during manufacture using the method described above with reference to FIG. 3, the default capacitance can be set to this capacitance value.

In step 205, the radio receiver 2 sets the capacitance to the default value (if it has not already done so) and measures the signal quality. Again, in this embodiment, the signal quality is measured by measuring the RF signal level. As with the method shown in FIG. 3, the default capacitance may correspond to the value of a particular capacitor in the switched bank of capacitors 11, in which case the switch control circuit 12 causes the integrated RF stage 10 to use that capacitor in the circuitry for receiving the RF signal, or the default capacitance may correspond to the value of two or more of the capacitors in the switched bank of capacitors 11 when they are used in series or parallel, in which case the switch control circuit 12 controls the integrated RF stage 10 to use the appropriate combination of capacitors in the bank of capacitors 11. Again, as with the method in FIG. 3, it is preferred that a Received Signal Strength Indication (RSSI) is used to measure the RF signal level. However, it will be appreciated by a person skilled in the art that alternative methods of measuring signal quality and RF signal levels could be used.

In step 207, the capacitance value is modified, which may involve switching to a different capacitor, or a different combination of capacitors, in the bank of capacitors 11, and the RF signal level is measured, again preferably using the RSSI.

As with the process in FIG. 3 described above, preferably the further iterations of step 207 to modify the capacitance value take into account the previous modifications to the capacitance value and its measured effect on the RF signal level.

In step 209, it is determined whether a capacitance has been identified that results in a maximum received RF signal for the radio station being received. If a maximum RF level has not been obtained, the process returns to step 207 where the capacitance value is modified and the RF signal level of the radio station measured.

If a capacitance has been identified that results in a maximum RF level for the radio station being received (i.e. the capacitance values surrounding the identified value have been tested and result in a lower RF signal level being received than with the identified value), the process passes to step 211 in which that capacitance value is used in the further reception of the signals for the desired radio station.

If required, the capacitance value can be stored in a memory (not shown in FIG. 1) along with an identity of the radio station for future use by the radio receiver 2. In this case however, in order to compensate for temperature and aging of the components of the radio receiver 2, the method in FIG. 4 should be repeated (preferably using the stored capacitance as a default value).

In any case, in order to compensate for possible RF signal level measurement errors caused by the use of amplitude modulation which influences the RF level, the processes shown in FIGS. 3 and 4 should preferably be repeated before selecting a final capacitance value for a particular frequency. In a preferred embodiment, the process is repeated at least three times.

The repetition of the processes preferably comprises repeating steps 103 to 111 or steps 203 to 209 respectively.

Although the radio receiver has been described as including a bank of capacitors, it will be appreciated that it is possible for the radio receiver 2 to include components that perform a similar function, for example a switched bank of varactors, which are diodes that are used as a capacitor, and in which the capacitance is changed by changing the reverse voltage applied to the diode. In addition, a combination of a DAC and a varactor can be used.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of configuring a radio receiver, the radio receiver comprising signal receiving circuitry, and at least one adjustable component coupled to the signal receiving circuitry; the method comprising:

setting the at least one adjustable component, the at least one adjustable component being adjustable to one of a plurality settings, to a first one of the settings for providing a component value based on a known frequency and power level;

measuring the quality of a signal received via the signal receiving circuitry in response to the most recent setting of the at least one adjustable component;

adjusting the at least one adjustable component to another one of the settings, and repeating the step of measuring the quality of the signal received;

repeating the steps of setting and measuring for at least a second setting selected from the plurality of settings; and determining the value of the at least one adjustable component that provides the highest measured signal quality.

2. The method of configuring a radio receiver as claimed in claim 1, wherein settings subsequent to the second value are selected from the plurality of settings on the basis of the signal qualities measured for at least two of the preceding settings.

3. The method of configuring a radio receiver claimed in claim 1, wherein the step of measuring the quality of a signal comprises measuring a strength of the signal.

4. The method of configuring a radio receiver as claimed in claim 1, wherein the signal received via the signal receiving circuitry and the at least one adjustable component has a known frequency.

5. The method of configuring a radio receiver as claimed in claim 1, wherein the signal received via the signal receiving circuitry and the at least one adjustable component has a known power level.

6. The method of configuring a radio receiver as claimed in claim 4, wherein the first setting selected from the plurality of settings is determined from the known frequency.

7. The method of configuring a radio receiver as claimed in claim 1, wherein the at least one adjustable component includes a switchable bank of capacitors.

8. The method of configuring a radio receiver as claimed in claim 1, wherein the at least one adjustable component includes a switchable bank of varactors.

9. The method of configuring a radio receiver as claimed in claim 1, wherein the at least one adjustable component includes a controllable combination of a DAC and a varactor.

10. The method of configuring a radio receiver as claimed in claim 1, wherein the steps of setting, measuring, repeating and determining are repeated in order to verify the result of the determining step.

11. The method of configuring a radio receiver as claimed in claim 1, wherein the steps of setting, measuring, repeating and determining are repeated for one or more signals having different frequencies.

12. A radio receiver, comprising:
signal receiving circuitry;
at least one adjustable component coupled to the signal receiving circuitry; and
processing circuitry adapted to:
set the at least one adjustable component, the at least one adjustable component being adjustable to one of a plurality of settings, to a first one of the settings for providing a component value based on a known frequency and power level; measure the quality of a signal received via the signal receiving circuitry in response to the most recent setting of the at least one adjustable component;
adjust the at least one adjustable component to another one of the settings, and repeat the of measuring the quality of the signal received;
repeat the steps of setting and measuring for at least a second setting selected from the plurality of settings; and
determine the value of the at least one adjustable component that provides the highest measured signal quality.

13. The radio receiver as claimed in claim 12, wherein the processing circuitry is further adapted to select settings subsequent to the second setting from the plurality of settings on the basis of the signal quality measured for at least two of the preceding settings.

14. The radio receiver as claimed in claim 12, wherein the processing circuitry is adapted to measure the quality of a signal by measuring the strength of the signal.

15. The radio receiver as claimed in claim 12, wherein the signal received via the signal receiving circuitry and the at least one adjustable component has a known frequency.

16. The radio receiver as claimed in claim 15, wherein the signal received via the signal receiving circuitry and the at least one adjustable component has a known power level.

17. The radio receiver as claimed in claim 15, wherein the processing circuitry is adapted to determine the first setting from the plurality of settings using the known frequency.

18. The radio receiver as claimed in claim 12, wherein the at least one adjustable component includes a switchable bank of capacitors.

19. The radio receiver as claimed in claim 12, wherein the at least one adjustable component includes a switchable bank of varactors.

20. The radio receiver as claimed in claim 12, wherein the at least one adjustable component includes a controllable combination of a DAC and a varactor.

21. The radio receiver as claimed in claim 12, wherein the processing circuitry is adapted to repeat the steps of setting, measuring, repeating and determining in order to verify the result of the determining step.

22. The radio receiver as claimed in claim 12, wherein the processing circuitry is adapted to repeat the steps of setting, measuring, repeating and determining for one or more signals having different frequencies.

* * * * *